(12) United States Patent
Li

(10) Patent No.: US 9,310,396 B2
(45) Date of Patent: Apr. 12, 2016

(54) APPARATUS AND METHODS OF MEASURING MINORITY CARRIER LIFETIME USING A LIQUID PROBE

(71) Applicant: Alliance for Sustainable Energy, LLC, Golden, CO (US)

(72) Inventor: Jian Li, Centennial, CO (US)

(73) Assignee: Alliance For Sustainable Energy, LLC, Golden, CO (US)

( * ) Notice: Subject to any disclaimer, the term of this patent is extended or adjusted under 35 U.S.C. 154(b) by 63 days.

(21) Appl. No.: 14/198,215

(22) Filed: Mar. 5, 2014

(65) Prior Publication Data

US 2014/0253161 A1    Sep. 11, 2014

Related U.S. Application Data

(60) Provisional application No. 61/772,995, filed on Mar. 5, 2013.

(51) Int. Cl.
*G01R 31/20* (2006.01)
*G01R 1/067* (2006.01)
*G01R 31/26* (2014.01)

(52) U.S. Cl.
CPC ........ *G01R 1/06783* (2013.01); *G01R 1/06755* (2013.01); *G01R 31/2648* (2013.01); *G01R 31/2642* (2013.01)

(58) Field of Classification Search
CPC ........... G01R 1/06755; G01R 1/06783; G01R 31/2642; G01R 31/2648
USPC ........... 324/71, 378, 403, 415, 425, 500, 537, 324/754.01, 754.03, 754.04, 755.01
See application file for complete search history.

(56) References Cited

U.S. PATENT DOCUMENTS

| | | | |
|---|---|---|---|
| 3,158,511 A | 11/1964 | Robillard | |
| 3,186,880 A | 6/1965 | Skaggs et al. | |
| 3,993,533 A | 11/1976 | Milnes et al. | |
| 4,116,751 A | 9/1978 | Zaromb | |
| 4,255,208 A | 3/1981 | Deutscher et al. | |

(Continued)

OTHER PUBLICATIONS

Pence et al., "Minority carrier lifetime measurement in GaAs", Proceedings of the IEEE, Jul. 1974, pp. 1030-1031.

(Continued)

*Primary Examiner* — Huy Q Phan
*Assistant Examiner* — Raul Rios Russo
(74) *Attorney, Agent, or Firm* — John C. Stolpa; Robert G. Pittelkow

(57) ABSTRACT

Methods and apparatus for measuring minority carrier lifetimes using liquid probes are provided. In one embodiment, a method of measuring the minority carrier lifetime of a semiconductor material comprises: providing a semiconductor material having a surface; forming a rectifying junction at a first location on the surface by temporarily contacting the surface with a conductive liquid probe; electrically coupling a second junction to the semiconductor material at a second location, wherein the first location and the second location are physically separated; applying a forward bias to the rectifying junction causing minority carrier injection in the semiconductor material; measuring a total capacitance as a function of frequency between the rectifying junction and the second junction; determining an inflection frequency of the total capacitance; and determining a minority lifetime of the semiconductor material from the inflection frequency.

20 Claims, 3 Drawing Sheets

(56) References Cited

U.S. PATENT DOCUMENTS

| | | | |
|---|---|---|---|
| 4,421,592 A | 12/1983 | Shuskus et al. | |
| 4,537,651 A | 8/1985 | Shuskus et al. | |
| 4,551,674 A * | 11/1985 | Miller | G01R 31/2648 257/E21.531 |
| 5,049,816 A * | 9/1991 | Moslehi | G01R 31/2656 324/754.23 |
| 5,977,788 A * | 11/1999 | Lagowski | G01R 31/2648 257/E21.531 |
| 6,369,603 B1 * | 4/2002 | Johnston | G01R 31/2656 257/E21.531 |
| 6,507,552 B2 * | 1/2003 | Gibson | G11B 9/14 369/126 |
| 6,632,691 B1 * | 10/2003 | Howland | G01R 31/2648 324/754.03 |
| 8,866,505 B2 * | 10/2014 | Baikie | B82Y 35/00 324/750.14 |

OTHER PUBLICATIONS

Palstrom, "Epitaxy of dissimilar materials," Annu. Rev. Mater. Sci., vol. 25, 1995, pp. 389-415.

Skaggs, et al., "Unsupported single crystal films of germanium," J. Appl. Phys. vol. 35, No. 10, Oct. 1964, pp. 3013-3015.

Outlaw, et al., "Free-standing thin film Ge single crystals grown by plasma-enhanced chemical vapor deposition," J. Appl. Phys. vol. 55, No. 6, Mar. 15, 1984, pp. 1461-1463.

Saiki, et al., "A complex heterostructure to achieve a single-crystalline MgO film on GaAs(001)," Jpn. J. Appl. Phys. vol. 37, Part 2, No. 12A, Dec. 1, 1998, pp. L1427-L1429.

Chang, et al., "Crystallininty and epitaxy of evaporated germanium films on sodium chloride substrates," Proc. 6th Internl. Vacuum Congr., Jpn. J. Appl. Phys. Suppl. 2, Pt. 1, 1974, pp. 601-604.

Szymonski, et al., "Structure and electronic properties of ionic nano-layers MBE-grown on III-V semiconductors," Thin Solid Films, vol. 367.

Schwennicke et al., "Morphology of thin NaCl films grown epitaxially on Ge(100)," Surface Science, vol. 293, 1993, pp. 57-66.

Lukas, et al, "Initial stages in the epitaxial growth of NaCl on Ge(001)," Surface Science, vol. 286, 1993, pp. 46-55.

Nowakowski, et al., "Preparation of Ge (100) substrates for high-quality epitaxial growth of group IV materials," Mater. Res, Soc. Symp. Proc., vol. 794, 2004, pp. T3.34.1-T3.34.6.

Osakabe et al., "Study of GaAs(001) surfaces treated in aqueous HCl solutions," Jpn. J. Appl. Phys. vol. 36. Part 1. No. 12A, Dec. 1997, pp. 7199-7125.

Li, et al., "Applications of Admittance Spectroscopy in Photovoltaic Devices Beyond Majority Carrier Trapping Defects", presentation given at the $37^{th}$ IEEE PVSC, Seattle, WA, Jun. 19-24, 2011.

Li, et al., "Applications of Admittance Spectroscopy in Photovoltaic Devices Beyond Majority-Carrier Trapping Defects", Paper presented at the $37^{th}$ IEEE PVSC, Seattle, WA, Jun. 19-24, 2011, pp. 000075-000078.

Li, et al., "Coordinated Electrical Characterization System for Photovoltaic Devices", Paper presented at the $35^{th}$ IEEE PVSC, Honolulu, HI, Jun. 20-25, 2010, pp. 001749-001752.

Li, et al., "Coordinated Electrical Characterization System for Photovoltaic Devices", Poster presented at the $35^{th}$ IEEE PVSC, Honolulu, HI, Jun. 20-25, 2010.

* cited by examiner

APPARATUS AND METHODS OF MEASURING MINORITY CARRIER LIFETIME USING A LIQUID PROBE

CROSS-REFERENCE TO RELATED APPLICATIONS

This Application claims priority to, and the benefit of, U.S. Provisional Application No. 61/772,995, entitled "APPARATUS AND METHODS OF MEASURING MINORITY CARRIER LIFETIME USING A LIQUID PROBE" filed on Mar. 5, 2013, which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

The charge carriers which can be created in semiconductor materials include electrons and holes. For a given semiconductor material, the more abundant charge carriers are identified as majority carriers and the less abundant carriers are known as minority carriers. Whether electrons or holes are the majority or minority carriers in any particular semiconductor material is typically a function of doping. Charge carrier generation and charge carrier recombination are the processes where mobile charge carriers are created and eliminated. For example, in a solar cell, the energy of an incident photon may create a charge carrier. Therefore, charge carrier lifetime is a key functional parameter of a semiconductor material. Minority carrier lifetime is defined as the average time it takes an excess minority carrier to recombine with a majority carrier. Therefore, it is important in many aspects of semiconductor processing and device fabrication to quickly, inexpensively and reasonably accurately determine the minority carrier lifetime of a semiconductor material.

Known techniques for determining minority carrier lifetime in a semiconductor material include the following: time resolved photoluminescence (TRPL), photoconductive decay (PCD), radio frequency quasi-steady-state photoconductance (RF-QSSPC), radio frequency transient photoconductance, infrared lifetime mapping with carrier density imaging (ILM/CDI) and microwave-detected photoconductance (MDP). The known techniques for determining minority carrier lifetime can, in certain instances, be expensive and difficult to implement. For example certain techniques rely upon relatively expensive laser light sources to stimulate the material under investigation. Some techniques are challenging to implement in a large scale production setting as well. Furthermore, known techniques for determining minority carrier lifetime may determine only the minority carrier lifetime of the surface region of a semiconductor material.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Methods and apparatus for measuring minority carrier lifetimes using liquid probes are provided. In one embodiment, a method of measuring the minority carrier lifetime of a semiconductor material comprises: providing a semiconductor material having a surface; forming a rectifying junction at a first location on the surface by temporarily contacting the surface with a conductive liquid probe; electrically coupling a second junction to the semiconductor material at a second location, wherein the first location and the second location are physically separated; applying a forward bias to the rectifying junction causing minority carrier injection in the semiconductor material; measuring a total capacitance as a function of frequency between the rectifying junction and the second junction; determining an inflection frequency of the total capacitance; and determining a minority lifetime of the semiconductor material from the inflection frequency.

The foregoing examples of the related art and limitations related therewith are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

Figure 1:
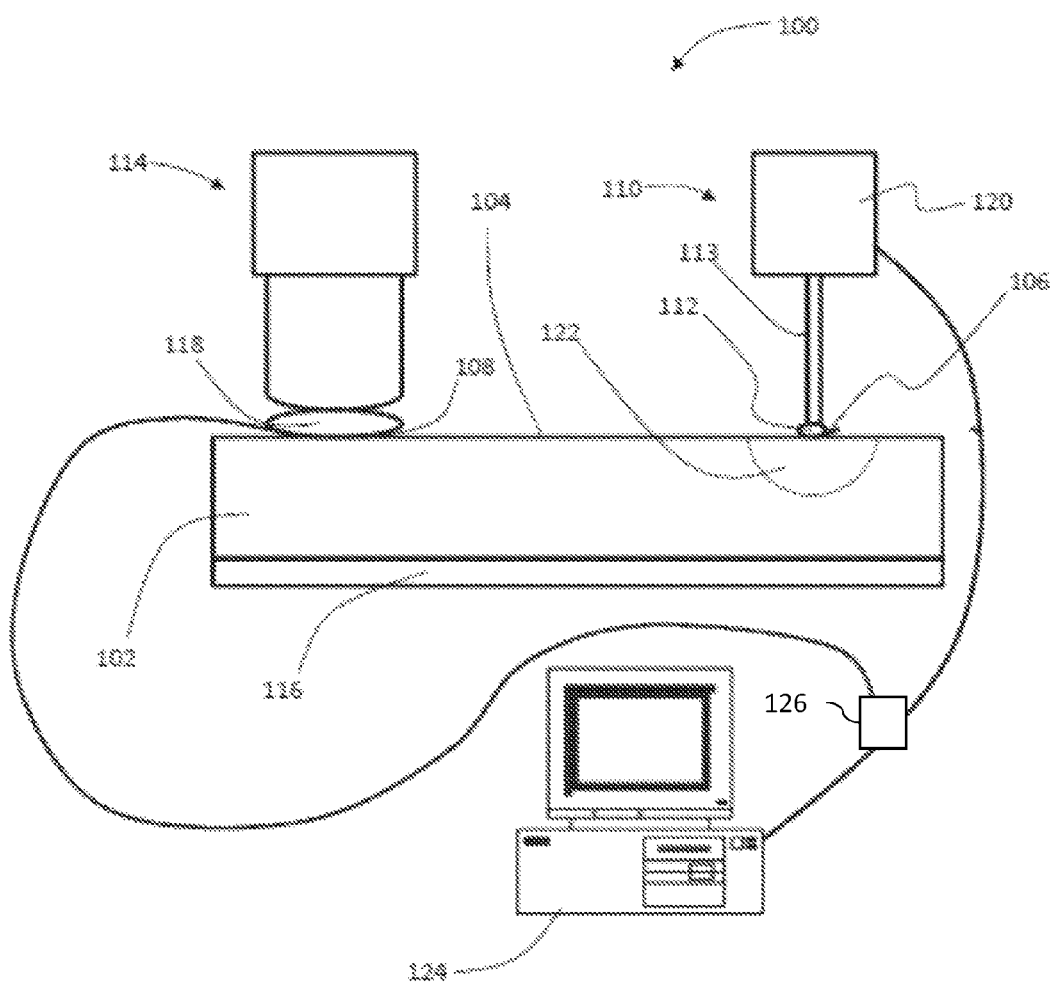
FIG. 1 is a diagram illustrating an example embodiment of a semiconductor material testing apparatus of the present disclosure.

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Unless otherwise indicated, all numbers expressing quantities of ingredients, dimensions, reaction conditions and so forth used in the specification and claims are to be understood as being modified in all instances by the term "about".

In this application and the claims, the use of the singular includes the plural unless specifically stated otherwise. In addition, use of "or" means "and/or" unless stated otherwise. Moreover, the use of the term "including", as well as other forms, such as "includes" and "included", is not limiting. Also, terms such as "element" or "component" encompass both elements and components comprising one unit and elements and components that comprise more than one unit unless specifically stated otherwise. Minority carrier lifetime is defined as the average time it takes an excess minority carrier to recombine with a majority carrier after the minority carrier has been generated.

The embodiments disclosed herein include methods of measuring or determining the minority carrier lifetime of a semiconductor material and apparatuses which are configured to implement the disclosed methods. The disclosed methods and apparatus are suitable for use with any type of semiconductor material, including but not limited to Si in wafer, ingot, or other form and semiconductor films, thin films or layers deposited on a substrate of any variety.

FIG. 1 is a schematic diagram showing selected elements of an apparatus 100 for determining or measuring minority carrier lifetime in a semiconductor material 102. The various elements illustrated in FIG. 1 are not drawn to scale. In FIG. 1, the semiconductor material 102 may be any semiconductor material. For the purpose of illustration, a semiconductor material 102 comprising a Si wafer will be discussed as an example material. The semiconductor material 102 has a surface 104 which is accessible for non-destructive probing as described herein. The surface 104 is shown in FIG. 1 as being an upper surface, but any surface of a semiconductor material in any configuration could be the contact point for the techniques described herein.

The embodiments of the present disclosure feature the formation of at least two junctions with the semiconductor material. The first junction is a rectifying junction 106 formed at a selected location on the semiconductor surface 104. The second junction 108 comprises a contact applied to a second location which may be on the semiconductor's surface 104 or electrically coupled to a contact formed on the semiconductor material 102. Either way, the second junction 108 is physically separated from the rectifying junction 106. Each of these junctions is described in detail below.

In the embodiment shown in FIG. 1, rectifying junction 106 is generated by a probe 110 that provides a conducting liquid 112 from a fluid conduit 113. Probe 110 may further include a power supply 120, which as that term is used herein comprises a device capable of maintaining a forward bias on rectifying junction 106. The rectifying junction 106 is formed by probe 110 when applied to surface 104, and is only temporary in nature. That is, the rectifying junction 106 only exists during testing (the time period when minority carrier lifetime testing occurs). After a test or measurement is complete, the probe 110 creating the rectifying junction 106 at the semiconductor surface 104 is withdrawn, destroying the rectifying junction 106 ideally without having changed the surface of the semiconductor material in any way.

It should be noted that a rectifying junction is formed at a conductor-semiconductor interface which has rectifying characteristics. Therefore, the rectifying junction 106 may belong to various categories including, but not limited to, a Schottky junction, a PN junction, a homojunction, a heterojunction, and a metal-insulator-semiconductor junction. Thus, rectifying junctions are often used as the basis for creating diodes, rectifiers other semiconductor components.

In the embodiment of FIG. 1, the rectifying junction 106 is formed using a conductive liquid 112 applied from an open end of the fluid conduit 113 onto the semiconductor surface 104. Such semiconductor surface may or may not be physically or chemically treated. Such semiconductor surface may or may not include an interface layer such as native oxide or intentionally deposited materials. Such semiconductor surface may or may not have a rectifying junction beneath the surface. Such semiconductor surface may or may not be smooth. The rectifying junction 106 formed by the probe 110 can be implemented using any conductive liquid 112 including but not limited to Hg, InGa alloys or liquid containing a suitable quantity of dissolved electrolytes. For the purpose of illustration, the FIG. 1 embodiment features Hg as the conductive liquid 112. The probe 110 may include an apparatus which can extend or withdrawal the conductive liquid 112 into or out of a fluid conduit 113 and into or out of contact with the semiconductor surface 104. Such an apparatus may be simply a drop or a layer of the liquid or may include one or more pumps or pressure/vacuum apparatus. For proper formation of rectifying junction 106, the contact area between the conductive liquid 112 and the semiconductor surface 104 should be relatively tiny. For example, the area of the surface 104 of the semiconductor material 102 in contact with the conductive liquid 112 may be less than or equal to 0.01 $cm^2$. In the embodiment used to calculate the minority carrier lifetime of a Si wafer described below, the area of the surface 104 of the semiconductor material 102 in contact with conductive liquid 112 was 0.005 $cm^2$.

The second junction made with the semiconductor material 102 is identified on FIG. 1 shown as junction 108. Unlike the rectifying junction 106, the second junction 108 has significantly greater conductance than junction 106 and, when connected in series with junction 106, exhibits little or no rectifying properties. In some embodiments, second junction 108 is temporarily implemented with a conductive liquid probe 114 similar to the probe 110. The second junction 108, which may be implemented with the same conducting liquid as the rectifying junction 106, will be made across an area of the surface 104 of semiconductor material 102 that is significantly larger than the area for the rectifying junction 106. For example, a second junction 108 made with a conductive liquid 118 such as Hg, may have a contact area greater than or equal to 0.1 $cm^2$. Alternatively, the conductive liquid 118 may comprise a conducting material different than that used for conductive liquid 112, and which may result in larger conductance in the second junction. In such cases, the area of the surface of the semiconductor material at the first location contacted with the first conductive liquid probe may not be substantially less than the area of the surface of the semiconductor material at the second location contacted with the second junction.

In one alternate embodiment, the second junction 108 with semiconductor material 102 may be made through front or back contacts previously applied to the semiconductor material 104. For example, the application of a back contact 116 is a typical step in the fabrication of a solar cell on a Si wafer substrate. For such a device, the back contact 116 may be temporarily used as the second junction for implementing the embodiments disclosed herein. For example, if the semiconductor material is a Si wafer with a previously applied back contact, the second junction may be made by providing a temporary electrical connection to the back contact opposite the location where the rectifying junction is to be made. If a dedicated conducting liquid probe 114 is used to make a second junction 108, the probe 114 may also include an apparatus configured to cause conducting liquid 118 to extend into contact and withdrawal from contact with the semiconductor surface 104 as desired. Such an apparatus may be simply a drop or a layer of the liquid or may include one or more pumps or pressure/vacuum apparatus. Regardless of whether the second junction 108 is made on the same surface 104 of the semiconductor material 102 as the rectifying junction 106, or made on an opposite surface (for example, if the semiconductor material 102 is a Si wafer with a previously applied back contact 116), the second 108 and rectifying junction 106 are physically separated.

In certain embodiments, such as shown in FIG. 1, the second junction is made on the same surface of the semiconductor material as the rectifying junction 106. The second junction and rectifying junction are, however, physically separated. Alternatively, the second junction may be made on a surface different from the surface of the rectifying junction. For example, if the semiconductor material is a Si wafer with a previously applied back contact, the second junction may be made by providing a temporary electrical connection to the back contact opposite the location where the rectifying junction is to be made.

As previously mentioned, the conducting liquid 112 applied from probe 110 is, or may be in electrical communication with a power supply 120 which is used to place a forward bias on the rectifying junction 106. Placing the rectifying junction 106 under forward bias causes a modification of a depletion region 122 within semiconductor material 102, and minority carrier injection into the bulk of semiconductor material 102. As is more fully described with respect to FIG. 2, placing the rectifying junction 106 under forward bias and causing minority carrier injunction causes a diffusion capacitance which can be measured and correlated to minority carrier lifetime.

Figure 2:
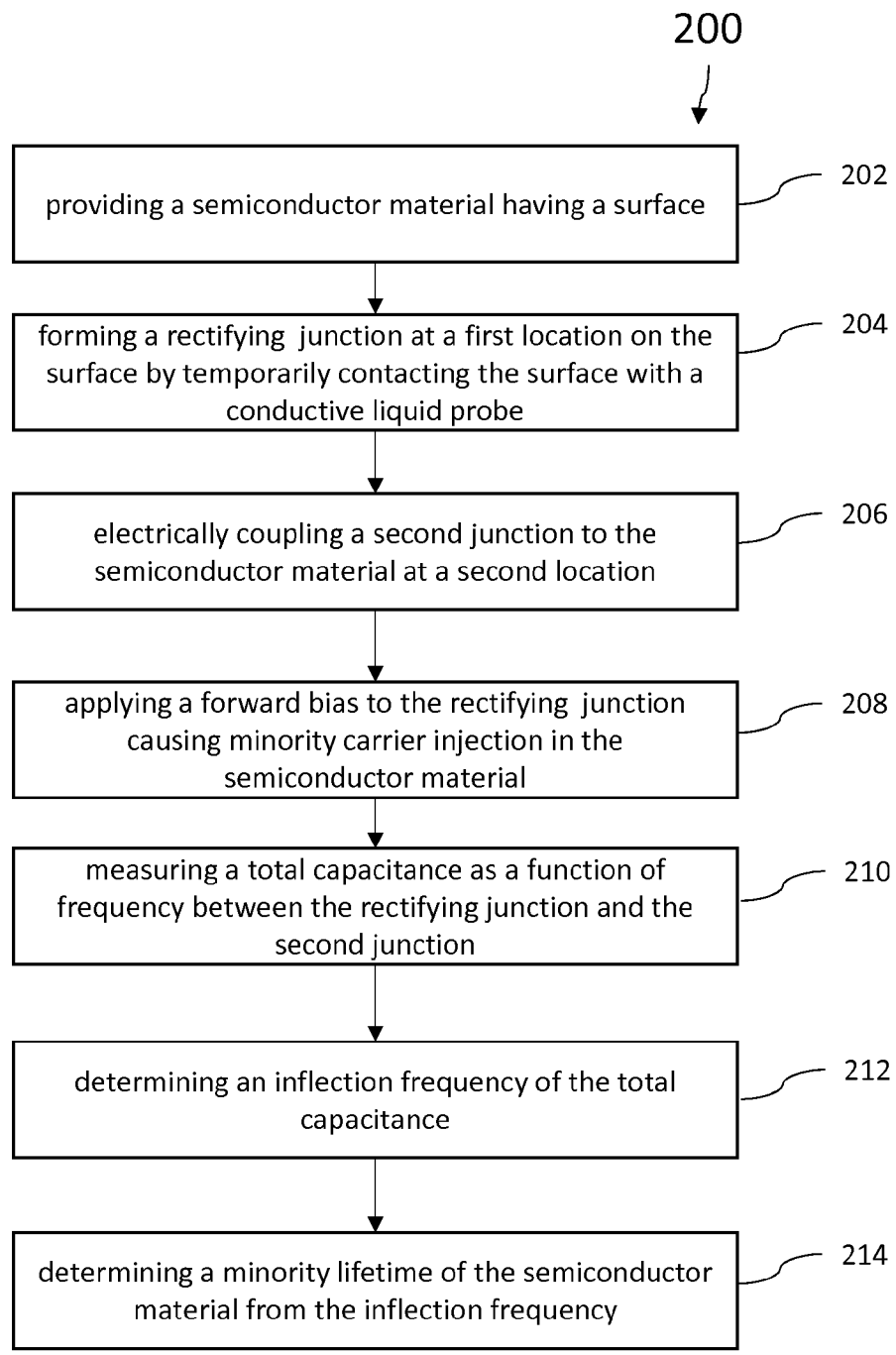
FIG. 2 is a flowchart illustrating a method example embodiment of the present disclosure.

FIG. 2 is a flow chart illustrating a method 200 for measuring minority carrier lifetime in a semiconductor material. In particular, as shown in FIG. 2, the method begins at 202 with providing a semiconductor material having a surface. Using method 200, the minority carrier lifetime of this semiconductor material may be measured, calculated or determined. In some embodiments, the testing apparatus 100 described with respect to FIG. 1 is implemented using method 200. The method proceeds to 204 with forming a rectifying junction at a first location on the surface by temporarily contacting the surface with a conductive liquid probe. In one embodiment, the conductive liquid probe is a conducting liquid probe 110 such as shown in FIG. 1. The method also proceeds to 206 with electrically coupling a second junction to the semiconductor material at a second location. As explained above, the first location and the second location are physically separated from each other. In one embodiment, the method at 206 further includes contacting the surface of the semiconductor material at the second location with the second junction. In other embodiments, the method at 206 alternately comprises coupling the second junction to a contact layer formed on the semiconductor material layer. In either case, the conductance of the second junction is larger than that of the rectifying junction. Steps 204 and 206 may be implemented in either order, but both the rectifying and second junctions are maintained during testing. The method then proceeds to 208 with applying a forward bias to the rectifying junction causing minority carrier injection in the semiconductor material.

As noted above, the application of a forward bias across the rectifying junction 106 causes the modification of a depletion region 112 in the semiconductor material 102 at the rectifying junction 106. Diffusion capacitance and depletion capacitance exist in association with the functioning of the rectifying junction 106 under forward bias. A portion of the total capacitance measured between the rectifying junction 106 and the second junction 108 under forward bias results from the diffusion capacitance which is due to generation and recombination of injected minority carriers.

Diffusion capacitance is frequency dependent. In addition, a curve showing diffusion capacitance (or total capacitance which includes diffusion capacitance under forward bias) as a function of frequency will exhibit an inflection frequency which is inversely proportional to the minority carrier lifetime. The inflection frequency may be identified by a negative peak in the differential (with respect to frequency) of the total capacitance spectrum. Accordingly, the method illustrated in FIG. 2 further includes proceeding to 210 with measuring a total capacitance as a function of frequency between the rectifying junction and the second junction. That is, the application of the forward bias also comprises sweeping a frequency of the forward bias voltage over a range. The method then proceeds to 212 with determining an inflection frequency of the total capacitance and to 214 with determining a minority lifetime of the semiconductor material from the inflection frequency. In one embodiment, the minority carrier lifetime may then be determined at 214 according to the following relationship:

$$2\pi f_{pk} \sim 1/\tau \quad (1)$$

where $\tau$ is the minority carrier lifetime and $f_{pk}$ is the inflection frequency determined at 212. Supplemental information concerning the relationship between a diffusion capacitance frequency spectrum and minority carrier lifetime is included in "*Minority carrier lifetime measurement in GaAs*" I. W. Pence and P. T. Greiling, Proc. IEEE, 1030 (1974) which is incorporated herein by reference for all matters contained therein.

As shown on FIG. 1, the apparatus 100 may further include an integrated or separate computer, controller or processor 124. The processor 124 may be, or may be part of a data processing system or other data processing device having non-volatile memory with instructions encoded thereon which cause the system one or more aspects of the embodiments described herein. In other embodiments, apparatus 100 may also include a capacitance measurement device or meter 126. In one embodiment, the capacitance meter 126 may comprise a module integrated within the processor 124 or a stand-alone device in digital communication with the processor 124. The capacitance meter 126 serves to measure the total capacitance between junctions 106 and 108 and provides measurements of the total capacitance as a function of frequency as an output for further processing by processor 124. In one embodiment, processor 124 evaluates capacitance measurements provided by the capacitance meter 126 as a function of frequency to identify the inflection frequency, $f_{pk}$, and from that calculate the minority carrier lifetime for semiconductor material 102. Further, in some embodiments, processor 124 controls operation of the power supply 120 of probe 110 including controlling the frequency of the forward bias applied across the rectifying junction 106. The capacitance meter 126 may be based on any mechanisms of determining capacitance such as an impedance bridge, an impedance analyzer, an LCR meter, and a lock-in amplifier. Capacitance data may be provided digitally from the capacitance meter 126 to the processor 124 and then correlated to the applied frequency.

In addition, the processor may execute instructions causing the system to move the conductive liquid probes 110 and 114 into and out of contact with the semiconductor surface 104, apply forward bias, and calculate minority carrier lifetime from the capacitance data. These and other steps may be executed automatically or semi-automatically with minimal user input. Therefore the apparatus and methods disclosed herein can be implemented on a production line to automatically or semi-automatically determine the minority carrier lifetime of a semiconductor material before, during or after selected processing steps.

EXAMPLE

The following example is provided for illustrative purposes only and is not intended to limit the scope of the embodiments disclosed herein. A silicon wafer was provided and placed onto the test platform of a Model 802 mercury probe manufactured by Materials Development Corporation. The selected Si (111) wafer was of n-type doping (n=5×10$^{15}$ cm$^{-3}$). The mercury probe provided a large (0.01 cm$^2$) second junction and a small (0.005 cm$^2$) rectifying junction (such as a Schottky junction) with a surface of the silicon wafer. A +0.8 V DC bias was applied to the silicon wafer. Using an Agilent 4294A impedance analyzer, the total capacitance (some of which is diffusion capacitance) between the first and second junctions was measured as a function of frequency and is plotted on FIG. 3 as graph trace 302.

Figure 3:
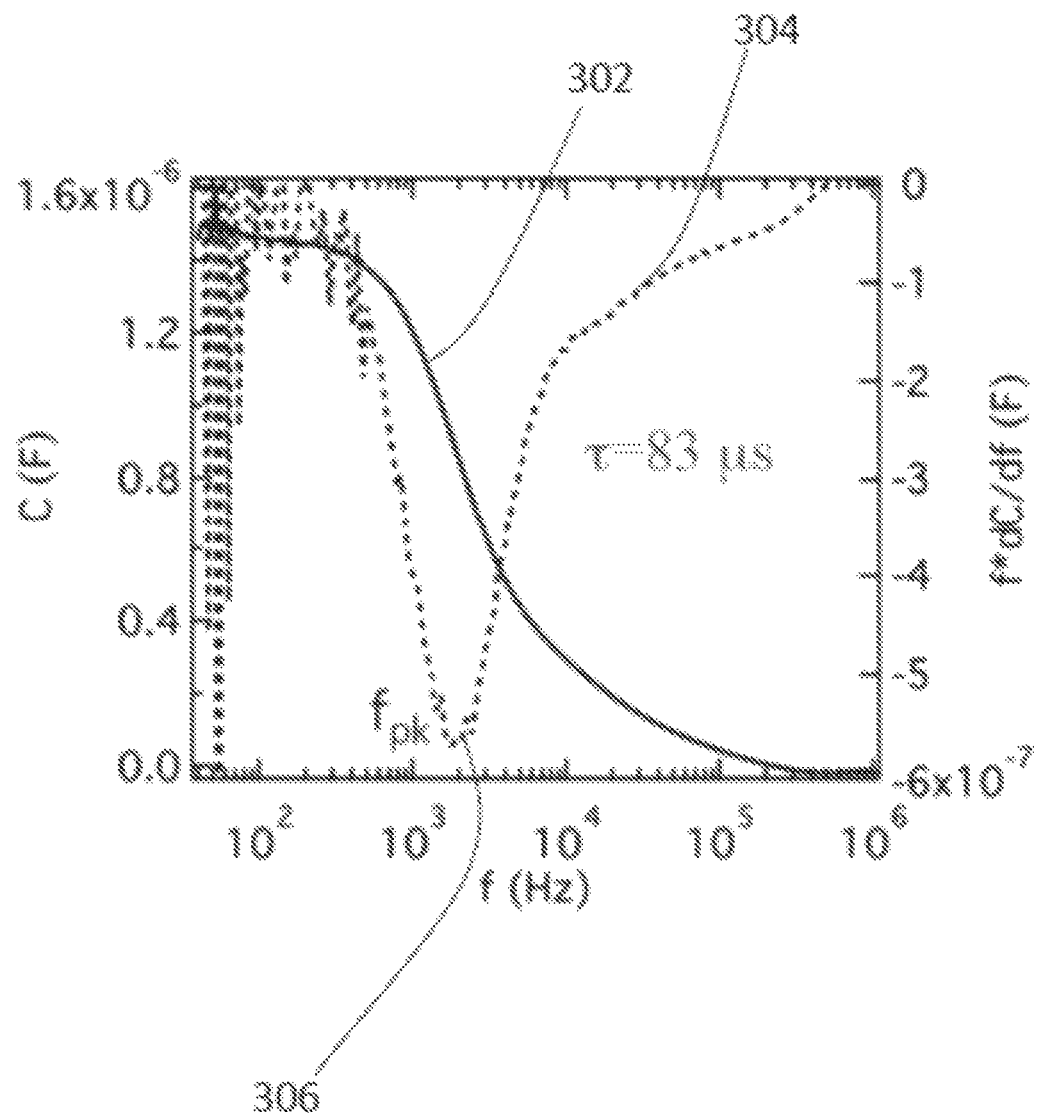
FIG. 3 is a graph illustrating the results of an example minority carrier lifetime determination.

The derivative of the diffusion capacitance as a function of frequency is also shown on FIG. 3 as graph trace 304. It may be noted on the plot of the derivative of capacitance as a function of frequency that an inflection frequency 306 occurs at about 1600 Hz. The approximate minority carrier lifetime of the silicon wafer may then be calculated as follows:

$$2\pi(1600) \sim 1/\tau$$

$$\tau \sim 100 \text{ μs}$$

The approximate minority carrier lifetime of 100 μs was verified using conventional microwave photoconductive decay methodology.

The description of the disclosed embodiments has been presented for purposes of illustration and description, but is not intended to be exhaustive or limiting of the claims to any particular form disclosed. The scope of the present disclosure is limited only by the scope of the following claims. Many modifications and variations will be apparent to those of ordinary skill in the art. The embodiments described and shown in the figures were chosen and described in order to best explain the principles of the various embodiments, the practical application, and to enable others of ordinary skill in the art to understand the various embodiments with various modifications as are suited to the particular use contemplated. Various embodiments of the disclosure could also include permutations of the various elements recited in the claims as if each dependent claim was a multiple dependent claim incorporating the limitations of each of the preceding dependent claims as well as the independent claims. Such permutations are expressly within the scope of this disclosure.

In various alternative embodiments, any of the systems or methods described throughout this disclosure may be implemented on one or more computer systems comprising a processor (such as processor 124) executing code to realize the processes, calculations, algorithms, functions, and other elements described with respect to the Figures, said code stored on a non-transient data storage device. Therefore other embodiments of the present disclosure include program instructions resident on computer readable media which when implemented by such computer systems, enable them to implement any of the embodiments described herein. As used herein, the term "computer readable media" refers to tangible memory storage devices having non-transient physical forms. Such non-transient physical forms may include computer memory devices, such as but not limited to punch cards, magnetic disk or tape, any optical data storage system, flash read only memory (ROM), non-volatile ROM, programmable ROM (PROM), erasable-programmable ROM (E-PROM), random access memory (RAM), or any other form of permanent, semi-permanent, or a temporary memory storage system or device having a physical, tangible form. Program instructions include, but are not limited to computer-executable instructions executed by computer system processors and hardware description languages such as Very High Speed Integrated Circuit (VHSIC) Hardware Description Language (VHDL).

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A method of measuring the minority carrier lifetime of a semiconductor material comprising:
   providing a semiconductor material having a surface;
   forming a rectifying junction at a first location on the surface by temporarily contacting the surface with a conductive liquid probe;
   electrically coupling a second junction to the semiconductor material at a second location, wherein the first location and the second location are physically separated;
   applying a forward bias to the rectifying junction causing minority carrier injection in the semiconductor material;
   measuring a total capacitance as a function of frequency between the rectifying junction and the second junction;
   determining an inflection frequency of the total capacitance; and
   determining a minority lifetime of the semiconductor material from the inflection frequency.

2. The method of claim 1, wherein electrically coupling a second junction to the semiconductor material further comprises coupling the second junction to the semiconductor material using a second conductive liquid probe.

3. The method of claim 1, wherein electrically coupling a second junction to the semiconductor material further comprises providing an electrical connection to a conductive contact layer associated with the semiconductor material.

4. The method of claim 1 wherein the first conductive liquid probe applies to the surface one of Hg, InGa alloy or a liquid comprising dissolved electrolytes.

5. The method of claim 1 wherein an area of the surface of the semiconductor material at the first location contacted with the first conductive liquid probe is less than an area of the surface of the semiconductor material at the second location contacted with the second junction.

6. The method of claim 5 wherein the area of the surface of the semiconductor material at the first location contacted with the first conductive liquid probe is less than or equal to 0.01 cm$^2$ and the area of the surface of the semiconductor material at the second location contacted with the second junction is greater than or equal to 0.1 cm$^2$.

7. The method of claim 1 wherein the semiconductor material is a Si wafer and the second location having the second junction is on a surface of the Si wafer different from the first location temporarily contacted with the first conductive liquid probe.

8. An apparatus for measuring the minority carrier lifetime of a semiconductor material comprising:
   a first conductive liquid probe providing for making temporary contact with a surface of a semiconductor material at a first location to form a rectifying junction;
   a second junction electrically coupled to the semiconductor material at a second location, wherein the first location and the second location are physically separated;
   a power supply in electrical communication with the first conductive liquid probe providing for the application of a forward bias to the rectifying junction, causing minority carrier injection in the semiconductor material;

a capacitance measuring module coupled to the rectifying junction and the second junction;

a processor in electrical communication with the first conductive liquid probe and the capacitance measuring module; and a non-transitory machine readable medium having encoded thereon a set of instructions executable by the processor to perform one or more operations, the set of instructions comprising instructions to:

measure a total capacitance between the rectifying junction and the second junction as a function of frequency;

determine an inflection frequency of the total capacitance as a function of frequency; and determine a minority carrier lifetime of the semiconductor material from the inflection frequency of the total capacitance as a function of frequency.

9. The apparatus of claim 8 wherein the second junction is provided with a second conductive liquid probe.

10. The apparatus of claim 8 wherein the second junction is provided with an electrical connection to a conductive front or back contact layer associated with the semiconductor material.

11. The apparatus of claim 8 wherein the first conductive liquid probe comprises one of Hg, InGa alloy or a liquid comprising dissolved electrolytes.

12. The apparatus of claim 8 wherein the area of the surface of the semiconductor material at the first location contacted with the first conductive liquid probe is less than the area of the surface of the semiconductor material at the second location contacted with the second junction.

13. The apparatus of claim 12 wherein the area of the surface of the semiconductor material at the first location contacted with the first conductive liquid probe is less than or equal to 0.01 cm$^2$ and the area of the surface of the semiconductor material at the second location contacted with the second junction is greater than or equal to 0.1 cm$^2$.

14. The apparatus of claim 8 wherein the semiconductor material is a Si wafer and the second location having the second junction is opposite of the Si wafer from the first location temporarily contacted with the first conductive liquid probe.

15. An apparatus for measuring minority carrier lifetimes in a semiconductor material, the apparatus comprising:

a semiconductor material comprising a surface;

a rectifying junction formed at a first location of the surface, the rectifying junction comprising a probe in contact with the surface via a conductive liquid;

a second junction electrically coupled to the semiconductor material at a second location physically separated from the first location;

a power supply coupled to the probe, the power supply configured to apply a forward bias across the rectifying junction such that minority carrier injection into the semiconductor material occurs and a depletion region within the semiconductor material forms, wherein the power supply sweeps a frequency of the forward bias across a frequency range;

a capacitance module coupled to the rectifying junction and the second junction, the capacitance probe outputting series of total capacitance measurements as a function of the frequency applied by the power supply; and a processor coupled to the capacitance module, wherein the processor outputs a calculated minority carrier lifetime of the semiconductor material by identifying an inflection point in the series of total capacitance measurements.

16. The apparatus of claim 15, wherein the probe further comprises:

a fluid conduit configured to supply the conductive liquid to the surface.

17. The apparatus of claim 16, wherein the second junction comprises a second probe in contact with the semiconductor material via a second conductive liquid, wherein the second probe comprises a second fluid conduit configured to supply the second conductive liquid to the semiconductor material.

18. The apparatus of claim 17, wherein one of both of the conductive liquid from the first probe and the second conductive liquid from the second probe comprise one of Hg, an InGa alloy, or a liquid containing a quantity of dissolved electrolytes.

19. The apparatus of claim 17, wherein the area of the surface of the semiconductor material at the first location interfacing the conductive liquid is less than or equal to 0.01 cm$^2$ and the area of the surface of the semiconductor material at the second location interfacing with the second junction is greater than or equal to 0.1 cm$^2$.

20. The apparatus of claim 15, wherein the second junction comprises an electrical connection to a conductive contact layer of the semiconductor material.

* * * * *